United States Patent
Singh (10) Patent No.: US 10,475,921 B2
(45) Date of Patent: Nov. 12, 2019

(54) LATERALLY DIFFUSED FIELD EFFECT TRANSISTOR AND A METHOD OF MANUFACTURING THE SAME

(71) Applicant: GLOBALFOUNDRIES Inc., Grand Cayman (KY)

(72) Inventor: Jagar Singh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/888,195

(22) Filed: Feb. 5, 2018

(65) Prior Publication Data

US 2019/0245080 A1      Aug. 8, 2019

(51) Int. Cl.

| H01L 29/78 | (2006.01) |
|---|---|
| H01L 29/08 | (2006.01) |
| H01L 29/06 | (2006.01) |
| H01L 29/66 | (2006.01) |
| H01L 29/423 | (2006.01) |

(52) U.S. Cl.
CPC ...... *H01L 29/7816* (2013.01); *H01L 29/0649* (2013.01); *H01L 29/0865* (2013.01); *H01L 29/0882* (2013.01); *H01L 29/4232* (2013.01); *H01L 29/66659* (2013.01)

(58) Field of Classification Search
USPC .................................................. 257/343
See application file for complete search history.

(56) References Cited

U.S. PATENT DOCUMENTS

| 7,405,443 | B1 | 7/2008 | Zuniga et al. |
| 9,418,993 | B2 | 8/2016 | Singh |
| 2003/0001198 | A1 | 1/2003 | Bromberger et al. |
| 2012/0211812 | A1* | 8/2012 | Du .................. H01L 29/0653 257/296 |
| 2014/0015048 | A1 | 1/2014 | Ng et al. |
| 2016/0163583 | A1* | 6/2016 | Liu .................. H01L 21/76229 257/401 |
| 2016/0240662 | A1* | 8/2016 | Park .................. H01L 29/4238 |
| 2016/0365848 | A1* | 12/2016 | Darwish ............ H01L 29/4236 |

* cited by examiner

*Primary Examiner* — Nilufa Rahim
(74) *Attorney, Agent, or Firm* — Amerson Law Firm, PLLC (57) ABSTRACT

An LDFET may be formed on the basis of manufacturing platforms designed for forming sophisticated small signal transistor elements. To this end, sidewall areas of trench isolation regions laterally positioned within the drift region may be used as current paths, thereby achieving increased design flexibility, since efficient current paths may still be established, even if the trench isolation regions have to extend into the substrate material due to design criteria determined by the sophisticated small signal transistor elements. In some illustrative embodiments, isolation of P-LD-FETs with respect to the P-substrate may be accomplished without requiring a deep well implantation.

20 Claims, 8 Drawing Sheets

LATERALLY DIFFUSED FIELD EFFECT TRANSISTOR AND A METHOD OF MANUFACTURING THE SAME

BACKGROUND

1. Field of the Disclosure

Generally, the present disclosure relates to semiconductor devices and manufacturing techniques in which laterally diffused field effect transistors may be formed on the basis of a manufacturing platform in which sophisticated small transistor elements also have to be implemented.

2. Description of the Related Art

Significant progress has been made over the past decades in the field of semiconductor devices by steadily reducing the lateral dimensions of the circuit elements, such as transistor elements, resistors, capacitors and the like. Although various approaches have been taken to form semiconductor devices of ever increasing performance and reduced dimensions, the CMOS technology has been proven to be a most viable candidate and has developed into a technical domain for producing powerful, yet cost effective, semiconductor devices. That is, in the CMOS technology, complementary transistor elements are provided, i.e., P-type transistor elements and N-type transistor elements, mainly based on silicon as the base semiconductor material. Due to the basic configuration of the transistor elements, being provided in the form of field effect transistors, the conductivity of which is controlled by a gate electrode structure, low static power consumption and high switching speed are achieved, which may be specifically advantageous in the production of high performance control circuitry.

Due to the continuous reduction of transistor dimensions, irrespective of the many technological challenges associated with the continuous reduction in size, high packing density has been generally achieved, thereby providing the potential of implementing entire systems even into a single semiconductor chip. Consequently, increasingly highly complex control circuitry may have to be combined with analog circuit portions, high power or high voltage circuit portions, RF (radio frequency) circuit elements and the like in order to comply with the various requirements of complex electronic systems. For example, in presently available complex semiconductor devices based on CMOS technology, transistor elements in the small signal domain having critical dimensions of 30 nm and even significantly less may be provided, for instance, in a planar architecture or a three-dimensional architecture, depending on performance and cost requirements. These small signal transistor elements may provide powerful control circuitry, including a large number of individual transistors, for example, up to several hundred million transistor elements, thereby requiring highly complex manufacturing techniques and process strategies. Upon implementing other circuit portions, which may require significantly increased power or voltage capabilities, for instance, by including switching elements for high power/high voltage applications, RF circuitry in the form of power amplifiers and the like, the highly complex manufacturing strategies implemented in respective platforms may have to take into consideration the various constraints associated with the very different transistor elements or, in general, circuit elements, of the various circuit portions.

For example, sophisticated transistor elements in the logic or memory area of a complex semiconductor device may require specifically designed gate electrode structures, drain and source regions and, in particular, channel regions with reduced parasitic capacitance so as to comply with the demand for extremely small switching times. This may result in extremely reduced dimensions of channel regions, drain and source regions and well regions in transistor architectures. On the other hand, implementing high power/high voltage transistor elements may require significantly different configurations of respective device regions, wherein, however, there is a strong economic demand for reducing the total number of complex manufacturing processes. Therefore, the economic success of complex semiconductor devices may significantly depend on a manufacturing strategy capable of concurrently applying as many process steps as possible for small signal transistor elements and high power/high voltage transistor elements.

For this reason, high power/high voltage transistor elements may have to be formed on the basis of process techniques that are also applicable to small signal transistor elements, while, nevertheless, providing the required performance characteristics of the high power/high voltage transistor elements. For example, so-called "laterally diffused field effect transistors" (LDFET) have been developed for sophisticated manufacturing platforms, in which many process steps, such as implantation steps and the like, may be commonly used for logic transistor elements and LDFET elements, thereby providing a very efficient compromise between performance and cost effectiveness.

Upon further scaling the dimensions of logic transistor elements, for example, requiring a gate length in planar transistor architectures of 30 nm and significantly less, it turns out, however, that, in particular, the requirement for deep well regions in LDFETs may contribute to process-related issues, since, in particular, deep N-well regions may be required to appropriately isolate the drain region of a P-LDFET from the typically P-doped substrate material. On the other hand, the small signal transistors will be formed without any deep well implantations. Therefore, additional and complex processes may have to be implemented, thereby contributing to overall process complexity and, thus, manufacturing costs.

In view of the situation described above, the present disclosure relates to semiconductor devices and manufacturing techniques in which LDFET devices may be formed on the basis of a sophisticated platform in a highly efficient manner, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is generally based on the concept that, even for highly scaled device dimensions, well regions having a profile and depth complying with requirements of sophisticated logic or small signal transistor elements may be used without additional deep dopant implantations, while still providing the required isolation of the drain region of high power/high voltage transistor elements, also referred to as LD (laterally diffused) field effect transistors. To this end, one or more current paths may be implemented in the drift region of the corresponding transistor elements on the basis of one or more trench isolation regions, irrespective of the penetration depth of the trench isolation regions. Consequently, even if design constraints for small signal transistor elements may require an extension of respective trench isolation regions into, or even beyond, the deepest isolating well region, a reliable current path is available near and around the respective sidewall portions of the trench isolation region. Based on this concept, a plurality of design features may be provided so as to further enhance overall performance of the LDFET element.

One illustrative embodiment disclosed herein relates to a laterally diffused field effect transistor. The laterally diffused field effect transistor comprises a first well region having a first conductivity type, wherein the first well region is formed above a substrate having the first conductivity type. Furthermore, the laterally diffused field effect transistor comprises a drain region having the first conductivity type, which is formed within the first well region. Moreover, a second well region is provided that has a second conductivity type, wherein the first well region is formed within the second well region. Additionally, the laterally diffused field effect transistor comprises a source region having the first conductivity type, which is formed within the second well region. Additionally, the laterally diffused field effect transistor comprises a trench isolation region that extends in a depth direction through the first well region and at least into the second well region, wherein the trench isolation region has a width dimension that is less than a width dimension of the first well region so as to form a space region for enabling current flow adjacent to sidewalls of the trench isolation region.

According to another illustrative embodiment disclosed herein, a laterally diffused field effect transistor is provided. The laterally diffused field effect transistor comprises a first well region having a first conductivity type formed above a substrate having the first conductivity type. Moreover, a drain region is provided that has the first conductivity type and is formed within the first well region and has a first width dimension. Additionally, a second well region is provided having a second conductivity type, wherein the first well region is formed within the second well region. A trench isolation region is laterally positioned in the first well region and has a second width dimension. Moreover, the laterally diffused field effect transistor comprises a source region having the first conductivity type, wherein the source region is formed in the second well region and has a third width dimension. The third width dimension is greater than the second width dimension, which, in turn, is greater than the first width dimension.

A still further illustrative embodiment disclosed herein relates to a method. The method includes forming a first well region of a first conductivity type in a device region of a semiconductor device. The method further includes forming a second well region of a second conductivity type below and laterally adjacent to the first well region. Additionally, the method includes forming a laterally diffused field effect transistor in the device region, wherein a drain region of the laterally diffused field effect transistor has the first conductivity type and is positioned in the first well region. Moreover, the second well region isolates the drain region from a substrate that has the first conductivity type.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As previously discussed, LDFET elements, in particular when provided on the basis of CMOS technology, are widely used as switches in integrated circuits, requiring the handling of high power/high voltage. Moreover, such transistor elements are also used in RF applications, for instance, as power amplifiers and the like, possibly in combination with small signal circuitry, as also discussed above. Typically, for switching applications, a main requirement for transistor elements is the reduction of the specific on-resistance in combination with a reduced switching speed, so as to reduce power consumption during the on-state and dynamic losses during the transient switching times. For RF applications, a high transconductance, i.e., the ratio of output current to input voltage or gate voltage, over a wide range of gate voltages is a highly desirable feature for RF amplifiers. Consequently, great efforts have been made in order to provide LDFET elements with the required characteristics and with high breakthrough voltage. As also discussed above, upon combining respective LDFET elements with small signal circuit elements, there is also the requirement to appropriately blend the respective device features and, thus, manufacturing processes, in order to accomplish an appropriate compromise between performance of the LDFET, taking into account the above-referenced characteristics of the LDFET element, and performance of the small signal transistor elements, while at the same time reducing overall process complexity and, thus, manufacturing costs.

Figure 1A:
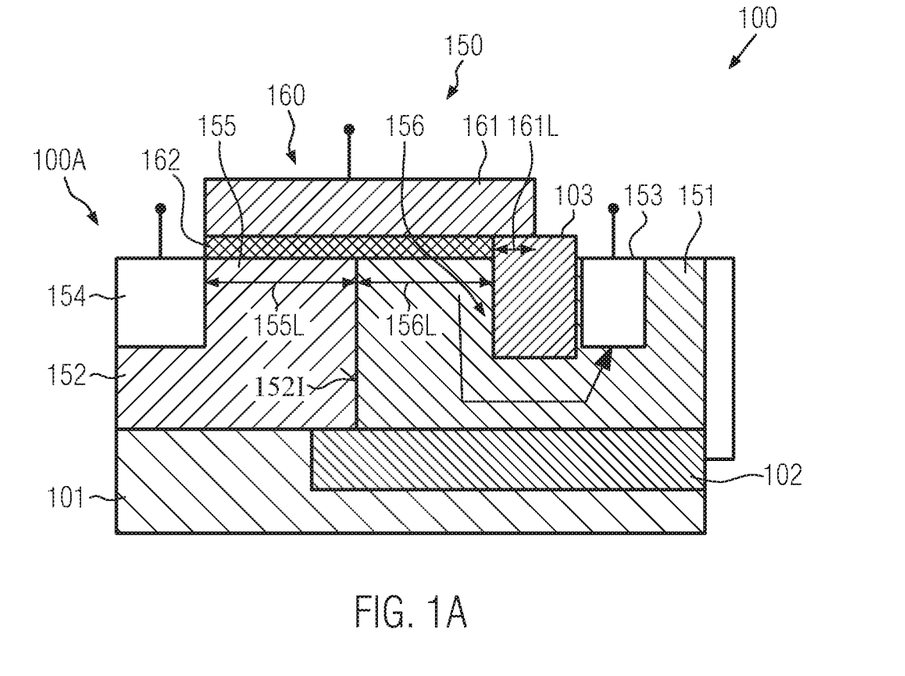
FIG. 1A schematically illustrates a cross-sectional view of a semiconductor device in which, in a first device region, an LDFET may be formed with a moderately complex dopant profile in deep semiconductor areas due to providing isolation of a drain region of the LDFET.

FIG. 1A schematically illustrates a cross-sectional view of a semiconductor device 100 in which, in a device region or semiconductor region 100A, a laterally diffused field effect transistor (LDFET) 150 may be formed on the basis of design criteria and a device architecture that is compatible with certain manufacturing processes and device features as may be used in other device regions in which small signal transistor elements (not shown) may have to be formed.

The semiconductor device 100 may comprise a substrate 101, typically provided in the form of a crystalline semiconductor material, such as a silicon material, that may have a specific doping, for instance, a P-dopant species may be frequently incorporated so as to establish a certain conductivity type. It should be appreciated that, throughout this application, a conductivity type is to be understood as the conductivity of a semiconductor device established by incorporating a specific dopant species, wherein a net excess of a specific dopant species may result in the corresponding conductivity type. For example, a semiconductor region including P-type dopant species and N-type dopant species in activated form, i.e., positioned at respective lattice sites of the base semiconductor material, may finally result in a P-conductivity when the total amount of the P-type dopant species is greater than a total amount of N-type dopant species.

The transistor element 150 may have incorporated therein a first well region 151, which, in the example illustrated, is represented by a well region having P-conductivity type, also referred to as a P-well region. A drain region 153 may be formed within the P-well region 151, which may typically comprise a dopant species of P-conductivity type with a moderately high concentration so as to obtain the desired low resistance. Furthermore, the transistor 150 may comprise a second well region 152 having a second conductivity type, i.e., an N-conductivity type, thereby forming an interface 1521 with the first well region 151.

It should be noted that, generally throughout this application, when reference is made to first and second conductivity types, it is to be understood that these conductivity types are different from each other and, thus, represent inverse conductivity types, i.e., P-conductivity and N-conductivity, respectively.

Furthermore, a source region 154 may be formed so as to connect to the second well region 152, thereby forming a respective PN junction similar to that in the interface 1521, however, with a significant increased dopant concentration on the side of the source region 154.

Moreover, the transistor element 150 may comprise a gate electrode structure 160 including a gate dielectric layer 162, such as a silicon dioxide layer, a silicon nitride layer and the like, having appropriate thickness and configuration so as to provide the required capability for receiving an appropriate gate voltage and resulting in a desired capacitive coupling to the underlying semiconductor regions, i.e., the first and second well regions 151, 152. Furthermore, the gate electrode structure 160 may comprise an electrode material 161, such as doped polysilicon material, possibly in combination with metal-containing materials (not shown) and the like.

Typically, the portion of the second well region 152 positioned adjacent to the gate electrode structure 160, i.e., the respective portion of the gate dielectric material 162, may be referred to as a channel region 155, since, here, a corresponding conductive channel may build up upon applying an appropriate control voltage to the gate electrode structure 160 and the source region 154. In sophisticated applications, a length of the channel region 155, indicated as 155L, may be approximately 250 nm and even less, for instance, when small signal transistor elements may have to be formed with critical dimensions, such as a gate length or a channel length of 30 nm and less.

A significant portion of the first well region 151 may act as a drift region, which is to provide a significant voltage drop along the total current path from the source region 154 to the drain region 153. In order to further increase the drift region and, thus, the respective current paths and voltage drop, a respective "barrier" may be implemented, which may be accomplished on the basis of a trench isolation region 103. Trench isolation regions having a configuration analogous to the trench isolation region 103 may additionally serve as a trench isolation region for laterally delineating respective active regions, in particular in other device areas, such as small signal device areas, wherein the configuration of the trench isolation regions may be designed in view of performance characteristics of the small signal transistors. For example, as shown, the trench isolation region 103 may include any appropriate dielectric material, such as silicon dioxide and the like, and may extend to a specific depth that is basically determined by design requirements in view of small signal transistors. Consequently, in combination with a drift region 156, i.e., a portion of the first well region 151, which may have a length indicated as 156L of approximately 325 nm, in sophisticated applications, the trench isolation region 103 may provide superior voltage characteristics, since a higher drain/source voltage may be received by the transistor 150 due to the presence of the trench isolation region 103. Frequently, in order to improve the function of a field plate of the trench isolation region 103, the electrode material 161 of the gate electrode structure 160 may be provided with a certain overlap, indicated as 161L, which may be on the order of 100 nm for the above-specified dimensions of the channel length 155L and the length 156L of the drift region 156.

Moreover, the transistor 150 may comprise a deep well region 102 having the second conductivity type, i.e., having an inverse conductivity type with respect to the substrate 101, thereby providing electrical isolation of the first well region 151 with respect to the substrate 101, since these regions may have the same conductivity type. Consequently, the deep well region 102 may have to be provided so as to reliably reach below the first well region 151 and to also laterally include the well region 151 so as to substantially avoid any undue current flow into the substrate 101.

As discussed above, the transistor element 150 may have to be formed on the basis of a specified manufacturing platform, which may also enable the formation of sophisticated small signal transistor elements (not shown), wherein a high degree of compatibility of the respective processes may be necessary so as to meet economic constraints. For example, the well regions 151, 152 may be formed on the basis of implantation processes, which may also have to be performed in other device regions so as to establish the required dopant profile for small signal transistors. Moreover, the deep well region 102 may also be formed in accordance with implantation processes as may have to be performed in other device regions. It should be noted that any of these implantation processes is typically associated with respective lithography processes in which appropriate lithography masks may have to be provided in order to appropriately define the lateral size and shape of respective implantation regions. Consequently, any additional implantation process requiring the lateral definition of a respective implantation region may necessitate a specific lithography mask and a corresponding process sequence, thereby significantly contributing to the overall manufacturing process, since lithography processes basically represent one of the most cost-intensive processes during the entire semiconductor device production.

Similarly, upon forming the trench isolation regions 103 in the device regions, the region 103 as shown in FIG. 1A may be formed, thereby imparting specific characteristics to the transistor 150 that are essentially determined by the basic configuration of any of the trench isolation regions formed. Thereafter, the gate electrode structure 160 may be formed by well-established process techniques, followed by forming the drain and source regions 153, 154, during which respective drain and source regions in other device areas may also be formed, possibly on the basis of different implantation parameters, while, nevertheless, using the same lithography mask for defining the lateral position, size and shape of the respective highly doped regions.

Upon further reducing the dimensions of sophisticated transistor elements, it may be necessary to appropriately adapt certain device components and to establish an appropriate process flow for forming these components.

Figure 1B:
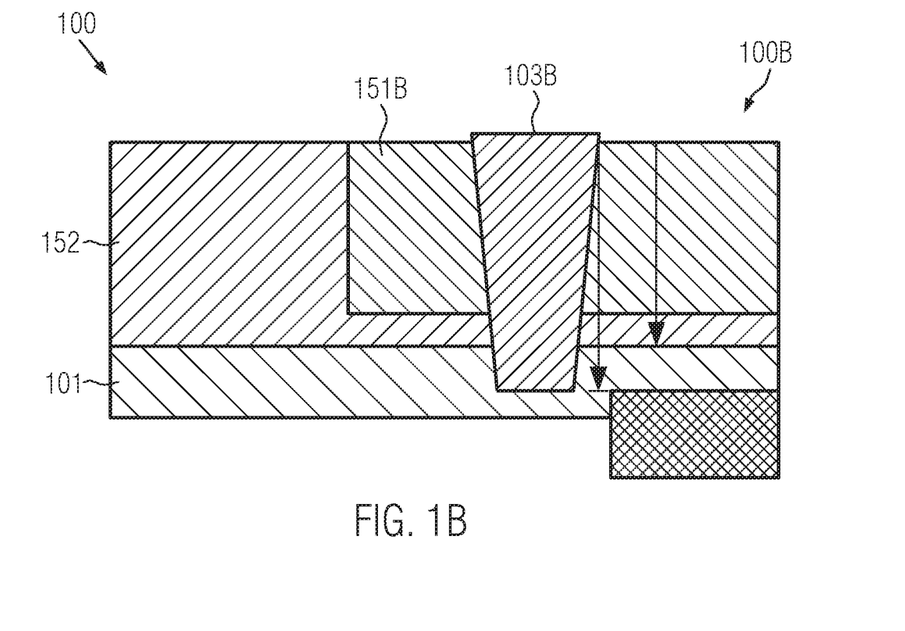
FIG. 1B schematically illustrates a cross-sectional view of the semiconductor device in a device region in which trench isolation regions and deep dopant profiles may have to be adapted to further scaled transistor dimensions of small signal transistor elements, thereby rendering the basic device architecture as shown in FIG. 1A highly complex and less cost efficient.

FIG. 1B schematically illustrates a cross-sectional view of a semiconductor device 100, for instance, the semiconductor device 100 as shown in FIG. 1A, wherein a device region 100B may be provided, which may represent a device region in and above which sophisticated small signal transistor elements (not shown) may have to be formed. In FIG. 1B, the semiconductor device 100 is shown so as to correspond to a semiconductor device that requires specific modifications in order to comply with further reduced lateral dimensions of respective circuit elements compared to the configuration as shown for the semiconductor device 100 in FIG. 1A with respect to the transistor 150 formed in the device region 100A.

For example, the further scaling of sophisticated planar transistor elements may require a reduction or adaption of depth dimensions of respective well regions and may further require an increased relative penetration depth of respective trench isolation regions. For example, design requirements may demand P-well regions, indicated as 151B, and N-well regions, indicated as 152, having a specific depth and dopant profile, whereas trench isolation regions, indicated as 103B, which extend into a specific depth may be required depending on corresponding design criteria of the small signal transistors to be formed in and above the device region 100B. For example, the isolation region 103B may extend even through the P-well region 151B and into the N-well region 152 and, for certain design cases, the depth of the trench isolation region 103B may even be greater than a depth of the N-well region 152. When respective components in the device region 100B are required for small signal transistors, it appears that the application of any such modified components to the configuration of the transistor 150 as shown in FIG. 1A may result in a non-functional device architecture, since assuming that the trench isolation region 103 in FIG. 1A may extend below the well region 151, basically any current flowing below the respective isolation region of extended depth would be blocked.

Moreover, in sophisticated approaches for further device scaling, implantation processes for forming deep well regions, such as the deep well region 102 in FIG. 1A, may no longer be implemented in order to provide superior process efficiency. In this case, the implementation of a deep well region, for instance, for re-establishing a current path below the trench isolation region 103B, may, therefore, result in additional process complexity and manufacturing costs, as already explained above. Consequently, since dopant profile and depth of respective well regions, such as the regions 152, 151, may be determined by design constraints for sophisticated small signal transistors, and since the depth of the trench isolation regions, such as the region 103B, may have to be increased in relation to the respective depth of the well regions 152, 151, the transistor configuration as shown in FIG. 1A may be less than desirable, since, in this case, significant additional process complexity would have to be implemented, for instance, for providing well regions of increased depth and/or providing additional trench isolation regions of appropriate depth and configuration.

Figure 1C:
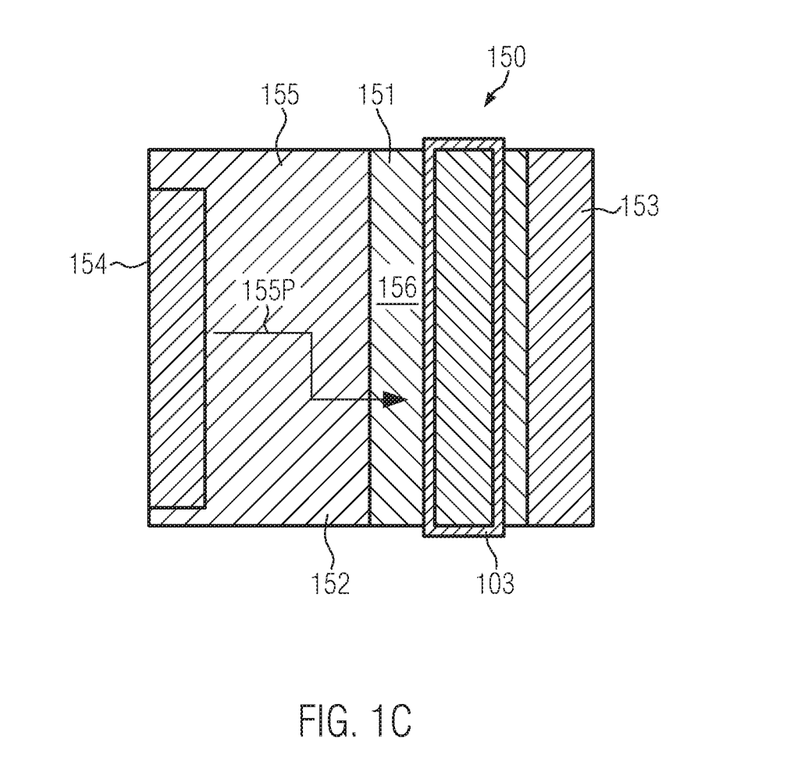
FIG. 1C schematically illustrates a top view of the semiconductor device of FIG. 1A so as to demonstrate the lateral dimensions of the LDFET of complex configuration.

FIG. 1C schematically illustrates a top view of the transistor element 150 during operation, wherein, for convenience, the gate electrode structure 160 is not illustrated. Consequently, for the configuration as shown in FIG. 1A, a current path 155P may be obtained from the source region 154 below the trench isolation region 103 to the drain region 153. Upon implementing a configuration as shown in FIG. 1B, i.e., the trench isolation region 103B of increased depth, however, the current path 155P would be blocked, thereby rendering the device architecture as non-functional.

According to the principles disclosed herein, it has been recognized that specific design criteria complying with the requirements of sophisticated small signal transistor elements may be used for LDFET elements, wherein, however, appropriate current paths may be obtained by establishing a current flow adjacent to sidewall portions of a trench isolation region, irrespective of the actual depth of the respective trench isolation region. To this end, lateral dimensions of the source region, the trench isolation region and the drain region may be adapted so as to establish one or more current paths around sidewall portions of the trench isolation region, thereby providing an effective drift region. Furthermore, in some illustrative embodiments, electrical isolation of the drain region may be accomplished on the basis of given design criteria for well regions of small signal transistors, without requiring the lateral definition of deep well regions, by providing at least one lateral current path along sidewall portions of the trench isolation region, thereby also providing superior compatibility of the LDFET architecture with the requirements of sophisticated small signal transistor elements having gate length dimensions of 30 nm and less, or 20 nm and less.

Figure 2A:
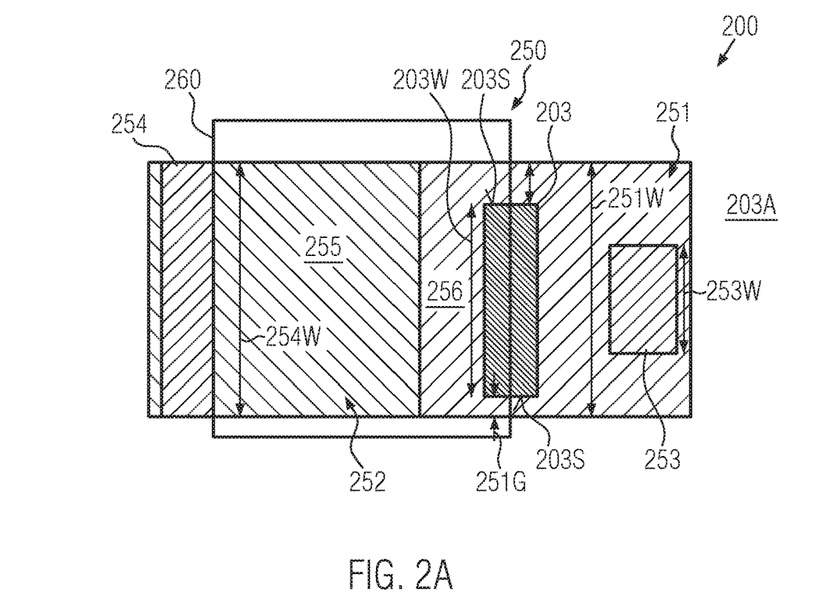
FIG. 2A schematically illustrates a top view of a semiconductor device including an LDFET of superior configuration so as to take into consideration design constraints, which may be dictated by requirements for logic transistors, for instance, with respect to depth of trench isolation regions and/or depth of deep well regions as illustrated in FIG. 1B.

FIG. 2A schematically illustrates a top view of a semiconductor device 200 having a specific device region, such as the device region 100A of the semiconductor device 100 of FIG. 1A, in which one or more laterally diffused field effect transistor (LDFET) elements 250 may be formed. On the other hand, in a different device region (not shown), such as the device region 100B of FIG. 1B, small signal transistor elements (not shown) requiring critical dimensions, such as a gate length of 30 nm and significantly less, may be formed on the basis of components and process techniques which may also be used for forming the transistor element 250.

The transistor 250 may comprise a first well region 251 of first conductivity type, for instance, P-conductivity type, when the transistor 250 represents a P-transistor element. Furthermore, a second well region 252 may be provided with a second conductivity type, which, as discussed above, is to be understood as an inverse or opposite conductivity type with respect to the first conductivity type. Furthermore, a drain region 253 is formed within the first well region 251 and a source region 254 is formed so as to connect to the second well region 252, similar to the configuration as discussed above with reference to the semiconductor device 100. Furthermore, a trench isolation region 203 may be formed so as to be laterally positioned within the first well region 251, while a depth of the trench isolation region 203 may correspond to a required depth in accordance with design criteria of other circuit elements, as discussed above. It should be appreciated that a gate electrode structure 260 may be formed and may be indicated by solid lines, which may include a gate dielectric material (not shown) and a gate electrode material (not shown), as will be described in more detail with reference to FIG. 2B.

It should be further appreciated that the transistor 250 may lack any deep well region and may be formed on the basis of the well regions 251 and 252 without any additional measures for isolating the first well region with respect to a substrate, as will be discussed later on in more detail.

Consequently, the second well region 252 of the second conductivity type may form a channel region 255 in combination with the gate electrode structure 260, as previously discussed, while a respective portion of the first well region 251 having the first conductivity type may represent a drift region 256 so as to increase a current path (in the gate length direction of the device) from the source region 254 to the drain region 253. Since the trench isolation region 203 may extend to any design determined depth, for instance, in some illustrative embodiments, the depth of the trench 203 may be such that it may extend entirely through the well region 251, a "lateral" current path may be provided along sidewall portions 203S of the trench isolation region 203, which may be accomplished by appropriately selecting a dimension of the trench isolation region 203 along a width direction W, i.e., a direction that corresponds to the gate width direction of the device (that corresponds to the vertical direction of FIG. 2A), that is less than a corresponding width dimension of the well region 251 in the same gate width direction of the device. That is, the width dimension, indicated as 203W, of the trench isolation region 203 is selected to be less than a width dimension, indicated as 251W, of the well region 251 in order to provide respective gaps or space regions, indicated as 251G, positioned between the sidewall surfaces 203S and the boundary of the well region 251 formed by a corresponding surrounding trench isolation region 203A, which may have basically the same configuration as the trench isolation region 203. Consequently, irrespective of the actual depth of the trench isolation region 203, the gaps or space regions 251G may provide lateral current paths and, thus, drift distances around the trench isolation region 203.

Furthermore, in the embodiment shown, the gate electrode structure 260 may be formed above a portion of the trench isolation region 203 and may also be formed above a portion of the gaps or space regions 251G, thereby providing a certain current controlling function upon applying an appropriate control voltage to the gate electrode structure 260. In the embodiment shown, the gate electrode structure 260 may span approximately half of a length dimension of the trench isolation region 203, which may represent a dimension along a length direction, which corresponds to the horizontal direction in FIG. 2A. Similarly, the gate electrode structure 260 may span approximately half of the gaps 251G along the length direction. It should be appreciated, however, that, in other illustrative embodiments (not shown), the gate electrode structure 260 may span a different portion of the trench isolation region 203 and the gaps 251G. In alternative embodiments, the gate electrode structure 260 may be positioned above at least a portion of the trench isolation region 203 so as to be aligned with the trench isolation region 203 or to laterally protrude from the trench isolation region 203 or to expose a portion of the trench isolation region 203.

In the illustrative embodiment shown in FIG. 2A, a width dimension of the source region, indicated as 254W, may basically correspond to a width dimension of the well region 252 in order to provide maximum current drive capability of the source region. Consequently, the width dimension 254W of the source region 254 is greater than the width dimension 203W, which, in turn, in the embodiment shown, is greater than a width dimension 253W of the drain region 253. In this manner, an efficient control of the current flow from the source region 254 via the gaps 251G to the drain region 253 may be established upon applying an appropriate control voltage to the gate electrode structure 260.

Figure 2B:
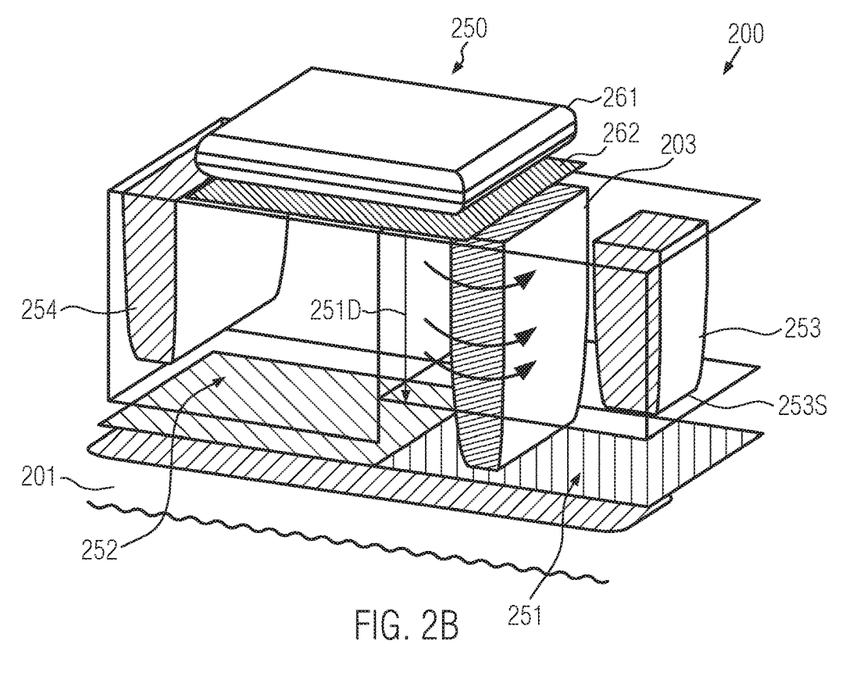
FIG. 2B schematically illustrates an exploded perspective view of the semiconductor device of FIG. 2A according to illustrative embodiments.

FIG. 2B schematically illustrates an exploded perspective view of the semiconductor device 200 as shown in FIG. 2A. As illustrated, the trench isolation region 203 extends deeply into the first well region 251 and, in some illustrative embodiments, the trench isolation region 203 may extend through the first well region 251 and into the second well region 252, which is positioned adjacent to the source region 254 and below the first well region 251. Consequently, the second well region 252 may efficiently electrically isolate the first well region 251 with respect to a substrate material 201, which may have the first conductivity type. Therefore, without requiring the provision of any further deep well region, the transistor 250 may be electrically isolated with respect to the substrate material 201. On the other hand, the sidewall surface areas 203S of the trench isolation region 203 may have a relatively steep and, thus, a nearly vertical sidewall, thereby efficiently delineating the gap or space regions 251G (see FIG. 2A) in order to provide a significant effective "width" of the transistor element 250. That is, even when the trench isolation region 203 may extend entirely through the first well region 251, thereby blocking any current path below the trench isolation region 203, an effective width may be obtained that is twice the depth of the first well region 251, as indicated by 251D. Furthermore, the drain region 253 and, thus, also the source region 254, since they may be formed on the basis of the same implantation process, may have a pronounced depth so that respective sidewall areas 253S may efficiently serve as current collecting areas, thereby also contributing to superior current drive capability of the transistor elements 250.

Further details of the semiconductor device 200 as well as a process of forming the same will be described hereinafter with continued reference to FIGS. 2A and 2B.

After providing an appropriate substrate, including the substrate material 201, for instance, in the form of a silicon substrate, such as a bulk substrate or an SOI (silicon- or semiconductor-on-insulator) substrate, appropriate lithography and masking processes may be applied in order to form the well regions 251, 252. That is, appropriate lithography masks may be used so as to define the lateral position, size and shape of respective well regions, such as the regions 251, 252, while, during respective masking and implantation processes, other well regions for small signal transistors may also be formed.

Prior to or after having performed the respective process sequences for forming the well regions 251 and 252, respectively, the trench isolation regions 203 may be formed by well-established lithography, etch, deposition and planarization techniques. For example, based on well-established recipes, an etch mask may be formed and respective anisotropic etch techniques may be applied for forming respective trenches with the required depth so as to comply with design criteria for small signal transistors, as already discussed above. Thereafter, any appropriate material may be filled in, which may comprise at least one dielectric material, such as silicon dioxide and the like, possibly in combination with other types of fill material, such as conductive fill materials, as will be discussed later on in more detail.

In some illustrative embodiments, the conductive fill material includes at least one of doped polysilicon, titanium, tungsten, tungsten silicide and other active gate materials. In some embodiments, the conductive fill material may extend to a bottom of the trench isolation region 203. The insulating layer (not shown) may comprise a silicon oxide based material and/or a silicon nitride based material and/or a high-k dielectric material. A high-k dielectric material is to be understood as a material having a dielectric constant of 10 or greater.

Next, the gate electrode structure 260 may be formed in accordance with well-established strategies by deposition and/or oxidation so as to form an appropriate dielectric material 262, as shown in FIG. 2B, with required thickness, followed by the deposition of one or more conductive electrode materials 261, which may be subsequently patterned on the basis of lithography and etch techniques, thereby obtaining the size, position and shape of the gate electrode structure 260.

The gate dielectric material 262 of the gate electrode structure 260 and a dopant profile formed below the gate dielectric material, for instance introduced during the previous implantation sequence, may be selected so as to control a threshold voltage of the laterally diffused field effect transistor 250. Moreover, in further illustrative embodiments, at least one of the one or more conductive electrode materials 261 of the gate electrode structure 260 is selected so as to additionally adjust the threshold voltage of the laterally diffused field effect transistor 250.

As discussed above, the gate electrode structure 260 may overlap with the trench isolation region 203 to a certain degree, so as to provide superior current control, in particular, in the gap or space regions 251G. As will be discussed later on, the patterning process may also include processes for removing a portion of the gate dielectric material 262 prior to depositing the electrode material 261, if a direct connection to a conductive material of the trench isolation region 203 may have to be established in this early manufacturing stage. Thereafter, the drain and source regions 253, 254 may be formed, for instance, by appropriate implantation processes, selective epitaxial growth techniques and the like, depending on the overall device requirements. As discussed above, a depth of the regions 253, 254 may be selected so as to obtain large sidewall surfaces for increasing the current drive capability.

Thereafter, the further processing may continue by forming contact elements (not shown) and a metallization system (not shown) in accordance with overall device requirements. It should be further appreciated that, at any appropriate stage, respective heat treatments may be applied so as to activate previously implanted dopant species, adjust dopant profiles, finely tune material characteristics and the like.

Figure 3A:
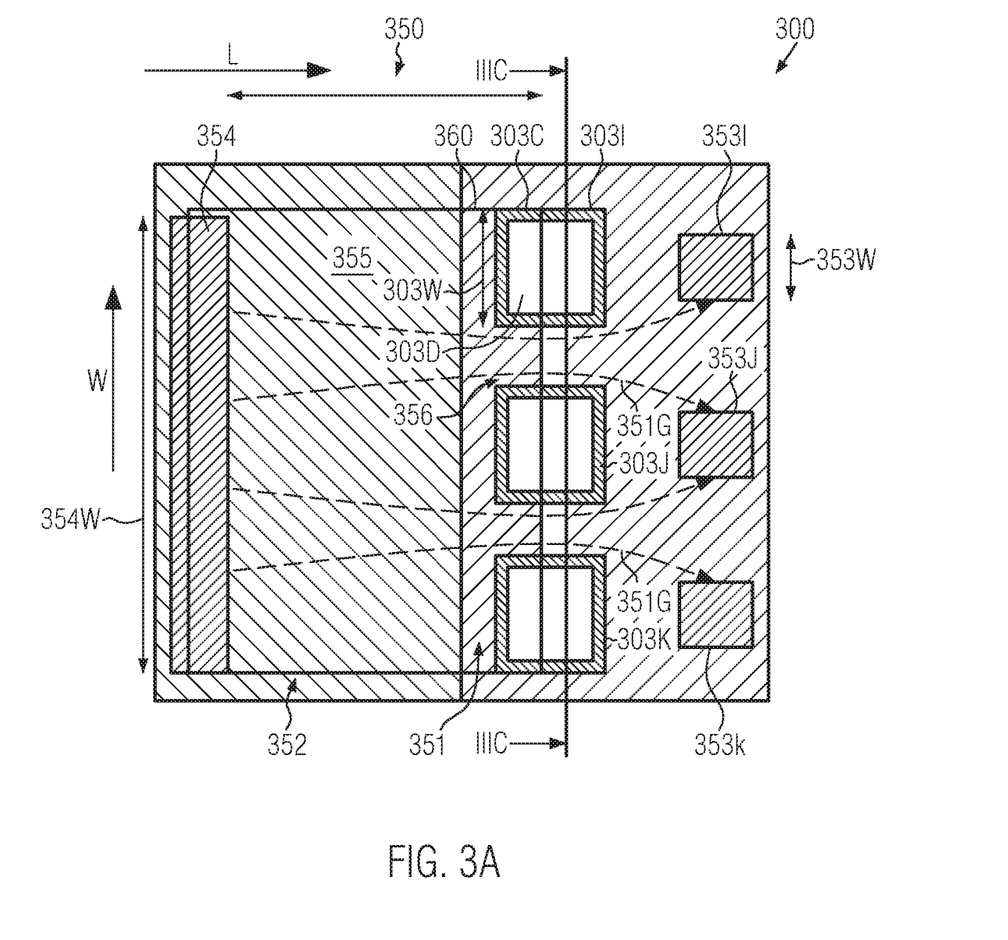
FIGS. 3A and 3B schematically illustrate a top view and a cross-sectional view, respectively, of a semiconductor device with superior transistor architecture for an LDFET device by providing current path laterally adjacent to one or more trench isolation regions, according to further illustrative embodiments.

FIG. 3A schematically illustrates a top view of a semiconductor device 300 according to further illustrative embodiments. As shown, the semiconductor device 300 may have basically the same configuration as the semiconductor device 200 as shown in FIG. 2A. That is, the semiconductor device 300 may comprise an LDFET element 350 including a substrate (not shown), a first well region of first conductivity type 351, a second well region of second conductivity type 352 and a source region 354 of the first conductivity type adjacent to the second well region 352. Furthermore, a trench isolation region may be provided as a segmented region including trench isolation regions or isolation portions 303I, 303J and 303K so as to be laterally positioned within the first well region 351, thereby forming lateral gap regions or space regions 351G. Moreover, a drain region may be provided as a segmented region including drain regions or drain portions 353I, 353J and 353K positioned within the first well region 351, wherein each of the respective drain regions or portions 353I, 353J, 353K may be appropriately positioned in the length direction L, "behind" a respective trench isolation region or portion 303I, 303J, 303K so as to block a direct current path from source to drain, that is, each of the drain portions 353I, 353J and 353K is "shadowed" by a respective one of the trench isolation portions 303I, 303J and 303K. Consequently, respective current paths, as indicated by the dashed lines, may be formed from the source region 354 through the gap or space regions 351G to respective ones of the drain portions 353I, 353J, 353K.

Moreover, the transistor element 350 may comprise a gate electrode structure 360, which may define, in combination with the underlying second well region 352, a respective channel region 355, as also previously discussed, wherein the gate electrode structure 360 may also cover a portion of the respective trench isolation regions 303I, 303J, 303K and of the gap or space regions 351G.

Basically, the transistor element 350 may be considered as a plurality of transistor portions arranged in parallel to each other so as to provide for required transistor performance. Thus, similar to the configuration as shown in FIG. 2A, the source region 354 may have a width dimension that is greater than a total width of the plurality of trench isolation portions 303I, 303J, 303K. That is, the sum of the individual width dimensions 303W of the respective trench isolation portions 303I, 303J, 303K is less than the width dimension 354W. Similarly, the total width dimension of the plurality of drain portions 353I, 353J, 353K is less than the total width dimension of the plurality of trench isolation portions 303I, 303J, 303K. That is, the sum of the individual width dimensions 353W of the respective drain portions 353I, 353J, 353K is less than the sum of the individual width dimensions 303W.

It should be appreciated that the number of individual trench isolation regions or isolation portions forming the segmented trench isolation region, as well as the size thereof, may be selected in accordance with overall device requirements and is not restricted to the number of portions shown in FIG. 3A. It should further be noted that at least some of the plurality of trench isolation portions 303I, 303J, 303K may have different shapes and sizes as long as the respective space regions 351G may be provided. Similar criteria also apply to the plurality of drain portions 353I, 353J, 353K.

For example, the plurality of isolation portions 303I, 303J, 303K may be provided as a square and/or a rectangle when viewed in top view. In some illustrative embodiments, the lateral dimensions of the plurality of laterally separated isolation portions 303I, 303J, 303K may be adjusted so as to control current flow at a drain side of the transistor element 350. In other embodiments, a number of the plurality of isolation portions 303I, 303J, 303K is selected so as to be comparable with a number of fins provided in finFETs formed by finFET technology. In still other embodiments, the lateral dimensions of the plurality of laterally separated isolation portions 303I, 303J, 303K may be adjusted so as to correspond to a maximum design number of isolation portions for a given lateral design dimension of the laterally diffused field effect transistor 350. In other embodiments, the lateral dimensions of the plurality of laterally separated isolation portions 303I, 303J, 303K may be adjusted so as provide a fully depleted configuration or a partially depleted configuration in the plurality of space regions 351G. For example, the lateral dimensions of the plurality of laterally separated isolation portions 303I, 303J, 303K may be adjusted so as provide a fully depleted configuration in at least some of the space regions 351G by selecting a width of each of the at least some space regions 351G to be approximately 110 nm or less.

In other embodiments, a lateral size of the space regions 351G may be selected so as to adjust on-resistance and breakthrough voltage of the laterally diffused field effect transistor 350 to respective design target values.

Furthermore, with respect to positioning the trench isolation region, for instance provided as segmented region including the isolation portions 303I, 303J, 303K, in some embodiments, the trench isolation region, for example, the isolation portions 303I, 303J, 303K, may be positioned in the first well region 351. In other embodiments, the trench isolation region, for instance, the isolation portions, may be positioned at a junction region formed by the first well region 351 and the second well region 352.

It is to be noted that the aforementioned criteria may also apply to the device 200, if appropriate.

Furthermore, in the embodiment shown, the trench isolation portions 303I, 303J, 303K may have any appropriate configuration, for instance, these regions may be filled with an insulating material, such as silicon dioxide and the like, while, in other cases, as shown, an insulating material 303C may be provided in combination with a conductive fill material 303D, such as doped polycrystalline silicon material, a metal-containing material and the like.

It should be appreciated that the materials as described in the context of the trench isolation region of the device 200 may also be applied in the context of the isolation portions 303I, 303J, 303K.

For example, in sophisticated applications, the width dimension 303W and also a length dimension may be on the order of approximately 100-300 nm, wherein the insulating material 303C may be provided as a layer having a thickness of approximately 10-30 nm, while the remaining volume may be filled with any appropriate conductive material.

Furthermore, if desired, different types of insulating materials may be used upon forming the trench isolation portions 303I, 303J, 303K. It should be appreciated that the dimensions of the trench isolation portions 303I, 303J, 303K and of the drain portions 353I, 353J, 353K may generally depend on the technology node to be implemented, which may be essentially determined by the required critical dimensions of small signal transistors to be formed in a different device region.

Figure 3B:
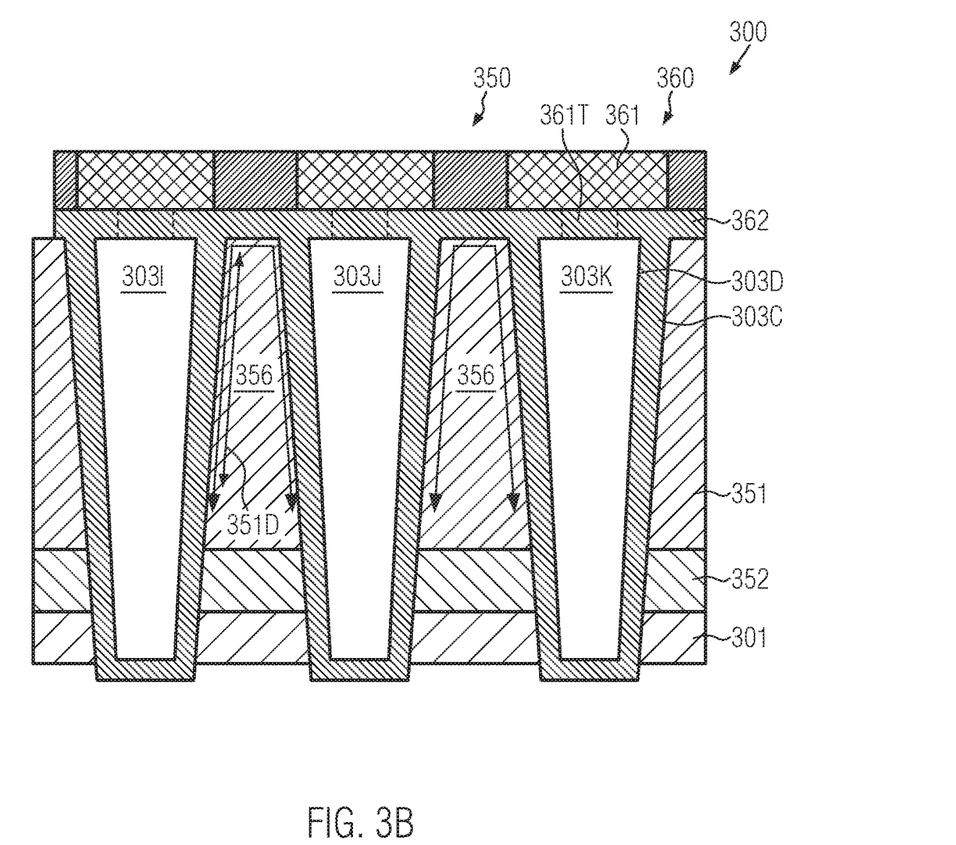

FIG. 3B schematically illustrates a cross-sectional view of the semiconductor device 300 of FIG. 3A, wherein the cross section may be taken along the line IIIC of FIG. 3A. As illustrated, in this area, the first well region 351 having the first conductivity type may form the drift region 356 between the respective trench isolation regions 303I, 303J, 303K. Moreover, as already discussed in the context of the semiconductor device 200 of FIGS. 2A and 2B, the second well region 352 may be formed so as to also be located below the first well region 351, thereby providing electrical isolation with respect to a substrate material 301, which may also have the first conductivity type. For example, when the first conductivity type represents the P-conductivity type, the transistor 350 may represent a P-type LDFET element. In other cases, all of the conductivity types may be inverted for an N-type LDFET, except for the substrate conductivity.

Moreover, in the illustrative embodiment shown, the trench isolation portions 303I, 303J, 303K may extend entirely through the first well region 351, through the second well region 352, and into the substrate material 301. As discussed above, a corresponding configuration may be required for sophisticated small signal transistor elements to be formed on the basis of 12 nm platform in order to provide superior lateral isolation and reduced substrate noise. Although a current path below the trench isolation portions 303I, 303J 303K is not available in this configuration, nevertheless, an efficient current path may be established at sidewalls of the trench isolation portions 303I, 303J, 303K through the space regions 351G. Consequently, a depth 351D of the respective trench isolation portions may, thus, add to an effective "width" of the transistor element 350. It should be appreciated that the measure 351D may not precisely represent the depth of the first well region 351, if a more or less pronounced sidewall angle of the trench isolation portions 303I, 303J, 303K may be present. In the context of the present application, however, a distance from the top of the first well region 351, for instance, defined by an interface between the gate dielectric material 362 of the gate electrode structure 360 and the first well region 351 down to the interface formed between the second well region 352 and the first well region 351, may be considered as the depth 351D, even if a more or less pronounced sidewall angle, for instance, in the range of 15 degrees to 0 degrees with respect to the vertical direction in FIG. 3B may be present. Consequently, the effective "width" of the transistor elements 350 may be represented by 4 times the depth 351D+2 times the width of the gap regions 351G.

Furthermore, in the embodiment illustrated in FIG. 3B, the conductive fill material 303D may not only provide superior heat conductivity into the substrate, but may also act as a field distributing area, since the conductive material 303D may be capacitively coupled to an electrode material 361 of the gate electrode structure 360. In other illustrative embodiments, the electrode material 361 may be electrically connected to the conductive material 303D, which may be accomplished by a "direct" connection, for instance, by providing respective openings 361T in the gate dielectric material 362, which may be filled with the electrode material 361. In other illustrative embodiments (not shown), a corresponding connection may be established on the basis of contact elements, which may have to be formed in a later stage in order to contact the source region 354, the plurality of drain regions 353I, 353J, 353K, and the gate electrode structure 360 and to connect these regions with other circuit elements. Electrically connecting the conductive material 303D of the trench isolation portions 303I, 303J, 303K to the gate electrode material 361 may provide superior current control capabilities of the transistor 350, since, in this case, the trench isolation portions 303I, 303J, 303K may act as control electrodes with the material 303D acting as an electrode material, while the material 303C may form a "gate dielectric material." For example, in some illustrative embodiments, the insulating material 303C may be formed with a configuration similar to the gate dielectric material 362 in terms of material composition and/or physical thickness, thereby providing similar conditions at the sidewalls of the trench isolation portions 303I, 303J, 303K and at the top interface of the gap or space regions 351G.

It is to be noted that a configuration regarding the depth of the plurality of trench isolation regions 303I, 303J, 303K and their internal configuration may also be applied to the embodiment as described in the context of FIGS. 2A and 2B, in which a single continuous trench isolation region may be used. Furthermore, with respect to materials used in the gate electrode structure 360, the same criteria may apply as previously set forth in the context of the gate electrode structure 260 of the transistor element 250.

The semiconductor device 300 as shown in FIGS. 3A and 3B may be formed on the basis of process techniques as also previously discussed, wherein the process for forming the one or more trench isolation regions or portions 303I, 303J, 303K may result in a trench that extends into the substrate material 301. Furthermore, by selecting implantation parameters such that the second well region 352 has an increased depth compared to the first well region 351, appropriate isolation may be obtained without any additional implantation process. The depth of the active region is, thus, defined, as explained above, by an interface formed between the bottom of the first well region 351 and the underlying portion of the second well region 352.

By positioning the respective drain regions 353I, 353J, 353K similar to the configuration in the embodiment described with respect to FIGS. 2A and 2B so as to be "shadowed" by the respective trench isolation regions or portions 303I, 303J, 303K, a direct current flow from source region to drain region is avoided, thereby contributing to an increased current path and, thus, to superior voltage drop within the drift region 356. Furthermore, by providing the trench isolation regions 303I, 303J, 303K, superior control of the current at the sidewall portions of the trench isolation regions, as well as limited effect of the electric field between the source region and the drain region, may be achieved, thereby also contributing to a higher breakdown voltage for the transistor 350.

Figure 4A:
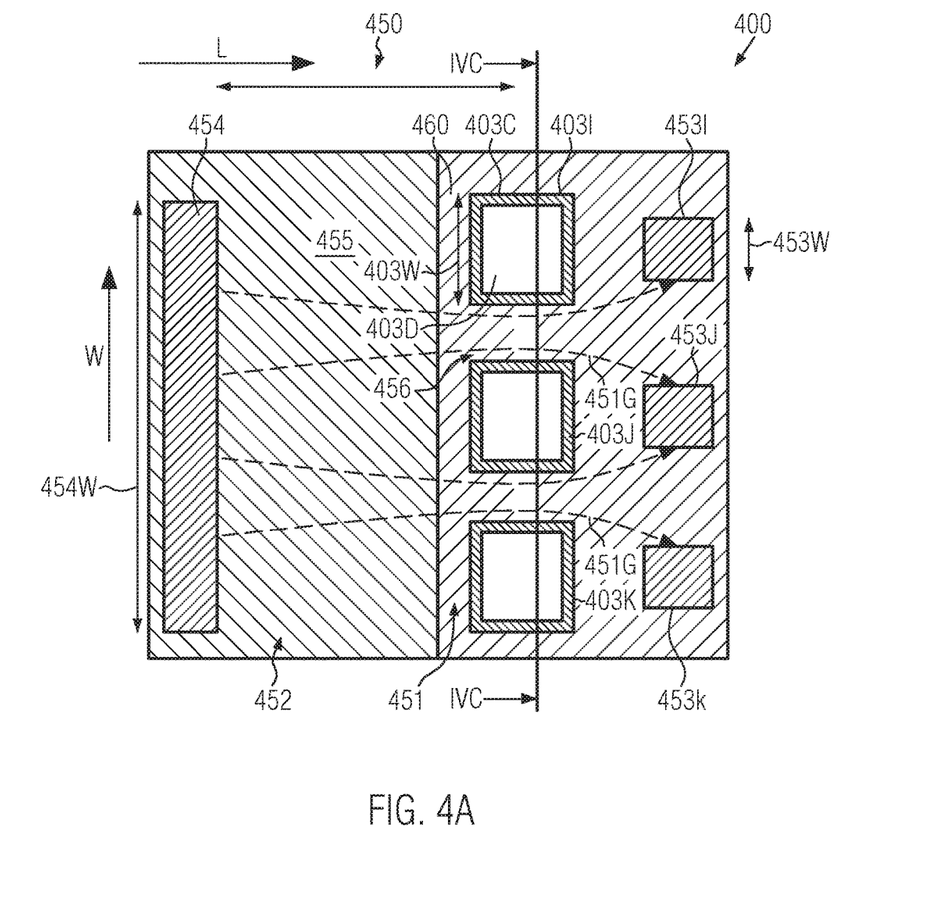
FIGS. 4A, 4B and 4C schematically illustrate a top view, a cross-sectional view and a perspective view, respectively, of a semiconductor device including an LDFET element based on current paths provided at and between sidewall portions of one or more trench isolation regions, which may extend deeply into the respective well region, according to still further embodiments.

FIG. 4A schematically illustrates a top view of a semiconductor device 400 having, in lateral directions, a configuration similar to the semiconductor device 300 described in the context of FIGS. 3A and 3B. That is, the semiconductor device 400 may comprise a transistor element 450 having a gate electrode structure 460, a plurality of drain regions or drain portions 453I. 453J, 453K positioned so as to be embedded in a first well region 451 of a first conductivity type, in which a plurality of trench isolation regions or isolation portions 403I, 403J, 403K may also be provided. Moreover, a second well region 452 of a second conductivity type may be provided so as to form, in combination with the gate electrode structure 460, a channel region 455 connecting to a source region 454.

Figure 4B:
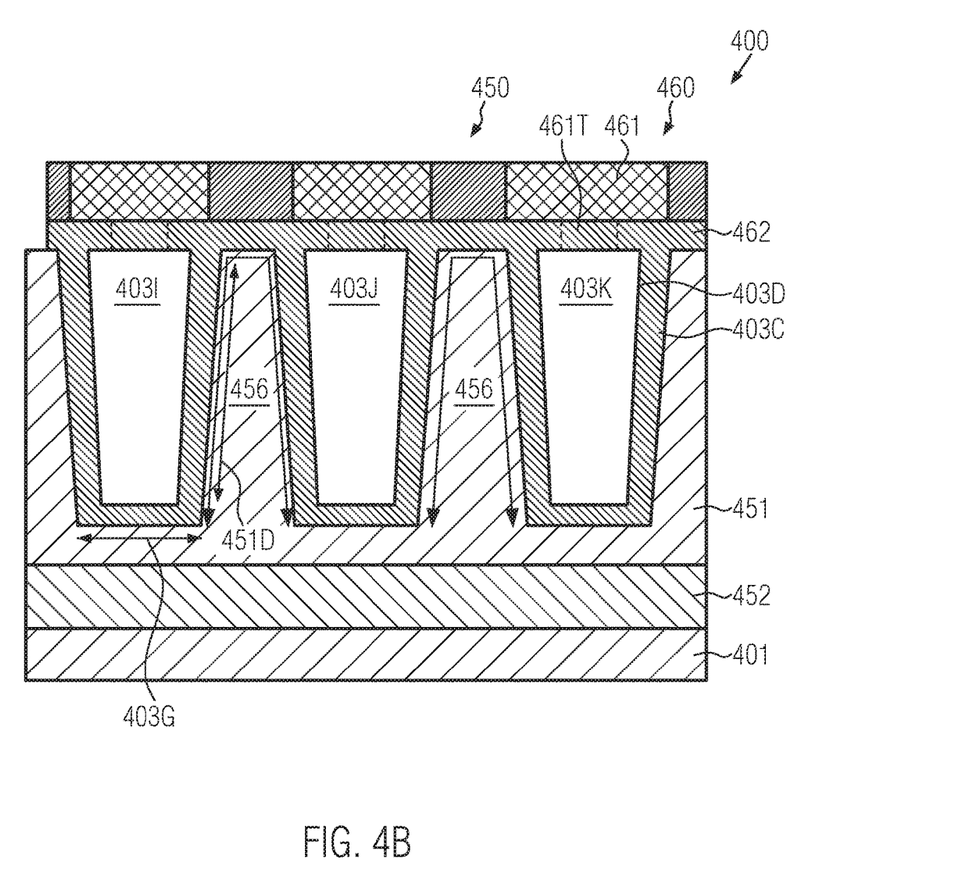

FIG. 4B schematically illustrates a cross-sectional view of the semiconductor device 400. As illustrated, the first and second well regions 451, 452 are provided so as to form a drift region 456 and to provide isolation to a substrate material 401 having the first conductivity type, as also explained above. In the embodiment shown, a depth 451D of the plurality of trench isolation regions 403I, 403J, 403K may be less than a depth of the first well region 451, depending on overall device requirements, for instance, with respect to any small signal transistor elements to be formed in other device regions, as discussed above. Consequently, in this case, the effective "width" of the transistor element 450 may be defined by the depth 451D, a width of respective gaps or space regions 451G (see FIG. 4A), and a width of the respective bottom portions, indicated as 403G, of the trench isolation regions 403I, 403J, 403K. It should be appreciated that, depending on a sidewall angle of the trench isolation regions 403I, 403J, 403K, a width dimension 403W (see FIG. 4A) may or may not slightly differ from the width at the bottom 403G. Furthermore, similar considerations may also apply to the depth 451D, as also discussed in the context of the semiconductor device 300 of FIGS. 3A and 3B.

With respect to the gate electrode structure 460, the same criteria may also apply as previously discussed. That is, a gate electrode material 461 may be formed so as to be positioned above a portion of the trench isolation regions 403I, 403J, 403K and may also be positioned above a portion of the gap or space regions 451G. Similarly, a gate dielectric material 462 may be positioned below the respective electrode material 461. In other illustrative embodiments, a conductive material within the trench isolation regions 403I, 403J, 403K may be connected to the electrode material 461, either in a direct manner or indirectly, for instance, on the basis of contact elements, as also discussed above.

In still other illustrative embodiments, the dielectric material 462 may be patterned, for instance, prior to depositing and patterning the electrode material 461, so as to include respective openings 461T in order to obtain direct contact between the electrode material 461 and the conductive materials in the trench isolation regions 403I, 403J, 403K.

Figure 4C:
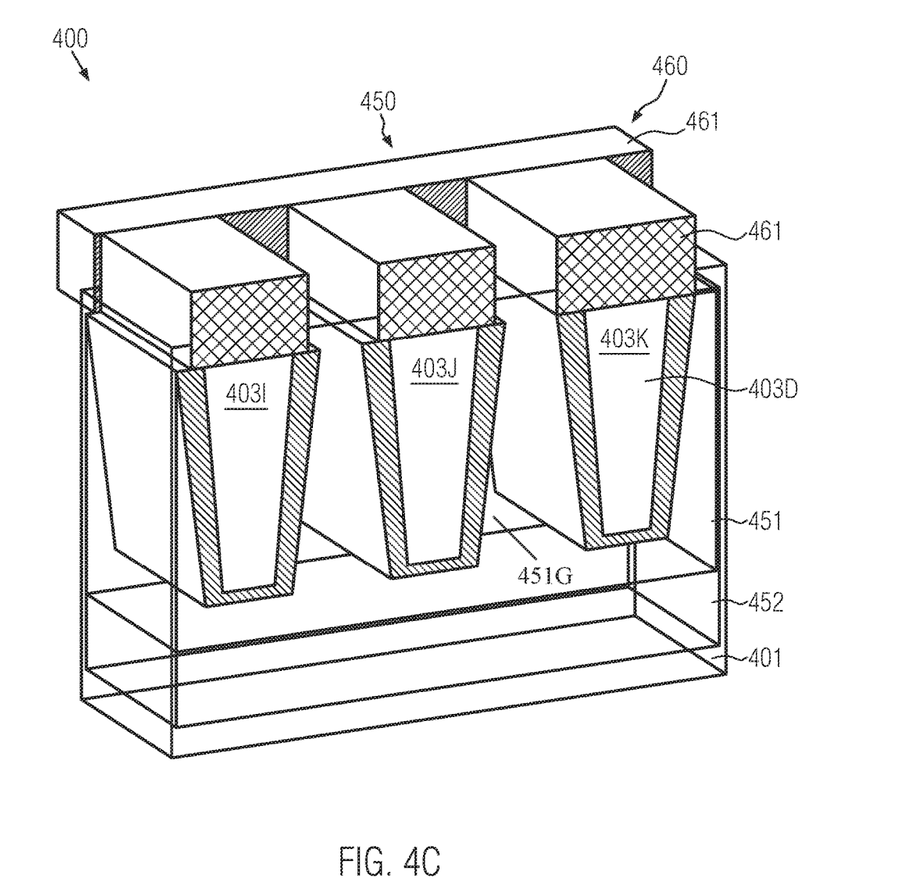

FIG. 4C schematically illustrates a perspective view of the semiconductor device 400 in which the gate electrode structure 460 may have a "stepped" lateral configuration so as to expose the gap regions 451G, while covering conductive material 403D of the respective trench isolation regions 403I, 403J, 403K. That is, as previously discussed, the gate dielectric material 462 (see FIG. 4B) may have been removed from above the trench isolation regions 403I, 403J, 403K so as to enable direct contact of the electrode material 461 with the conductive material 403D. In order to avoid direct contact of the electrode material 461 with the surface of the first well region 451 in the gap regions 451G, respective portions of the electrode material 461 have been removed. In this case, nevertheless, sufficient control of current flow in the gap regions 451G may be achieved. It should be appreciated that the stepped portion of the gate electrode structure may cover only a portion of the trench isolation regions 403I, 403J, 403K so that also a portion of the gap regions may still be covered by the gate dielectric material 462 and the electrode material 461.

The criteria previously set forth in the context of the devices 200 and 300, for instance with respect to materials of the gate electrode structures, the isolations portions, the configuration in terms of a fully depleted or a partially depleted architecture and the like, may also apply to the device 400.

As a result, the present disclosure provides semiconductor devices and manufacturing techniques in which laterally diffused field effect transistors may be provided on the basis of a manufacturing platform that may also enable the formation of sophisticated small signal transistor elements having critical dimensions of 30 nm, 20 nm and less. For example, in sophisticated applications, fully depleted transistor elements may be provided on the basis of an SOI architecture or a bulk architecture, wherein, as discussed above, upon further device scaling, certain process steps may be omitted, such as the formation of deep well regions. The concept disclosed herein may allow the omission of any such deep well region implantations, thereby significantly reducing overall process complexity and providing a high degree of compatibility with the respective manufacturing platform. Moreover, the concepts of the present disclosure may also provide superior design flexibility in providing trench isolation regions, since, irrespective of an actual depth of the corresponding trench isolation regions, a desired isolation to the substrate may be accomplished, while still ensuring superior current flow control and providing sufficient drift lengths. To this end, the current path is directed along sidewalls of one or more trench isolation regions positioned laterally within the drift region, i.e., the first well region. Even if respective isolation trenches may have to be formed so as to extend entirely through the first well region or drift region and into the underlying isolating second well region, efficient current paths may be obtained along the respective sidewall areas of the one or more trench isolation regions. Consequently, independent of the penetration depth of the respective trench isolation regions, an effective "width" of the LDFET element may be defined by the trench depth, possibly in combination with a bottom width, if the trench isolation region terminates within the drift region, and in combination with a width of top gap regions.

Moreover, a certain degree of "geometric" current flow control may be achieved by appropriately adapting the lateral size, position and shape of the trench isolation regions, for instance, by providing a segmented configuration in the form of a plurality of individual trench isolation regions in combination with appropriately adapted drain regions, which may, for instance, also be provided as a segmented configuration. Furthermore, by providing a conductive material within the trench isolation regions, superior heat conductivity may be accomplished, while current flow control may also be enhanced, which, in some illustrative embodiments, may be even further improved by connecting the conductive material to the gate electrode material. In this case, the one or more trench isolation regions may act as control electrodes for even further enhancing current flow control, thereby resulting in improved voltage drop from source to drain, however, while still providing a low on-resistance due to the significantly increased effective "width" of the LDFET element.

As discussed above, by forming the second well region so as to extend more deeply into the substrate material, efficient isolation may be achieved with respect to the substrate material. For example, when the first well region has P-conductivity and the substrate has P-conductivity, the deeper second well region of N-conductivity may provide isolation. The same holds true for P-type LDFET elements, when respective conductivity types are reversed.

Based on the superior current flow control by means of the sidewall areas of the trench isolation regions, possibly in combination with an appropriately designed gate electrode structure, which may cover at least a portion of the trench isolation regions and the drift region, for instance, any gap regions provided between laterally adjacent trench isolation regions, the charge carriers may penetrate more deeply into the drift region, which may be additionally enhanced by appropriately adapting a depth of the one or more drain regions.

In some further variants of the illustrative embodiment as discussed in the section "Summary of the Disclosure" and in the previous detailed description, the laterally diffused field effect transistor has a conductive fill material and the conductive fill material extends to a bottom of the trench isolation region.

In a further variant, the laterally diffused field effect transistor has an insulating layer and the insulating layer comprises at least one of a silicon oxide based material, a silicon nitride based material and a high-k dielectric material.

In a further variant, the electrode material of the gate electrode structure is electrically connected to the conductive fill material.

In a further variant, a width dimension of the trench isolation region is greater than a width dimension of the drain region.

In a further variant, the trench isolation region is segmented into a plurality of laterally separated isolation portions so as to form a plurality of the space regions.

In a further variant, the plurality of isolation portions are provided as at least one of a square and a rectangle when viewed in top view.

In a further variant, lateral dimensions of the plurality of laterally separated isolation portions are adjusted so as to control current flow at a drain side.

In a further variant, a number of the plurality of isolation portions is selected so as to be comparable with a number of fins provided in finFETs formed by finFET technology.

In a further variant, the lateral dimensions of the plurality of laterally separated isolation portions are adjusted so as to correspond to a maximum design number of isolation portions for a given lateral design dimension of the laterally diffused field effect transistor.

In a further variant, the lateral dimensions of the plurality of laterally separated isolation portions are adjusted so as provide one of a fully depleted configuration and a partially depleted configuration in the plurality of space regions.

In a further variant, the lateral dimensions of the plurality of laterally separated isolation portions are adjusted so as provide a fully depleted configuration in at least some of the space regions by selecting a width of each of the at least some space regions to be approximately 110 nm or less.

In a further variant, a lateral size of the space regions is selected so as to adjust on-resistance and breakthrough voltage of the laterally diffused field effect transistor to respective design target values.

In a further variant, the trench isolation region is positioned in the first well region.

In a further variant, the trench isolation region is positioned at a junction region formed by the first well region and the second well region.

In a further variant, the drain region comprises a plurality of laterally separated drain portions.

In a further variant, each of the drain portions is shadowed by a respective one of the plurality of trench portions along the length direction.

In a further variant, a length of a channel region formed in the second well region is approximately 250 nm or less.

In a further variant, a lateral distance of the trench isolation region from an interface formed by the first and second well regions is approximately 325 nm or less.

In a further variant, the first conductivity type is a P-type conductivity.

In a further variant, the laterally diffused field effect transistor further comprises an N-type deep well region formed below the first well region.

In some variants of the illustrative method as discussed in the section "Summary of the Disclosure" and in the previous detailed description, the trench isolation region is formed so to extend to a depth that is less than a depth of the second well region.

In a further variant, the drain and source regions are formed by implanting a dopant species to a depth that exceeds a depth of the trench isolation region.

In a further variant, some of the methods disclosed herein further comprise forming contact elements connecting to the drain and source regions and to the gate electrode structure and forming a metallization system connecting to the contact elements.

In a further variant, the method discussed above further comprises forming a small signal SOI transistor based on a well region formed below a buried insulating layer together with the second well region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A laterally diffused field effect transistor having a gate length direction and a gate width direction, the laterally diffused field effect transistor comprising:
   a first well region having a first conductivity type and a first width dimension in said gate width direction, said first well region being formed above a substrate having said first conductivity type;
   a drain region having said first conductivity type and a second width dimension in said gate width direction that is less than said first width dimension, said drain region being formed within said first well region;
   a second well region having a second conductivity type that is opposite said first conductivity type, said first well region being formed within said second well region;
   a source region having said first conductivity type, said source region being formed within said second well region; and
   a trench isolation region extending in a depth direction through said first well region and at least into said second well region, said trench isolation region having a third width dimension in said gate width direction that is less than said first width dimension and greater than said second width dimension so as to form a space region for enabling current flow adjacent to sidewalls of said trench isolation region.

2. The laterally diffused field effect transistor of claim 1, wherein said trench isolation region extends in said depth direction through said second well region and into said substrate.

3. The laterally diffused field effect transistor of claim 1, wherein said trench isolation region terminates in said second well region so as to enable additional current flow below said trench isolation region.

4. The laterally diffused field effect transistor of claim 1, further comprising a gate electrode structure positioned above portions of said first and second well regions and above at least a portion of said trench isolation region.

5. The laterally diffused field effect transistor of claim 4, wherein said gate electrode structure is positioned above at least said portion of said trench isolation region by one of being aligned with said trench isolation region, laterally protruding from said trench isolation region and exposing another portion of said trench isolation region.

6. The laterally diffused field effect transistor of claim 4, wherein a gate dielectric material of said gate electrode structure and a dopant profile formed below said gate dielectric material are selected so as to control a threshold voltage of said laterally diffused field effect transistor.

7. The laterally diffused field effect transistor of claim 6, wherein an electrode material of said gate electrode structure is selected so as to additionally adjust said threshold voltage of said laterally diffused field effect transistor.

8. The laterally diffused field effect transistor of claim 4, wherein said trench isolation region comprises an insulating layer and a conductive fill material.

9. The laterally diffused field effect transistor of claim 8, wherein said conductive fill material includes at least one of doped polysilicon, titanium, tungsten, tungsten silicide and other active gate materials.

10. The laterally diffused field effect transistor of claim 1, wherein said first well region has a lower concentration of dopant species with said first conductivity type than said drain region.

11. A laterally diffused field effect transistor having a gate length direction and a gate width direction, the laterally diffused field effect transistor comprising:
a first well region having a first conductivity type, said first well region being formed above a substrate having said first conductivity type;
a drain region having said first conductivity type, said drain region being formed within said first well region and having a first width dimension in said gate width direction, wherein said first well region has a lower concentration of dopant species with said first conductivity type than said drain region;
a second well region having a second conductivity type that is opposite said first conductivity type, said first well region being formed within said second well region;
a trench isolation region positioned in said first well region and having a second width dimension in said gate width direction, wherein said trench isolation region is laterally separated from said drain region by a portion of said first well region having said lower concentration of dopant species; and
a source region having said first conductivity type, said source region being formed within said second well region and having a third width dimension in said gate width direction, said third width dimension being greater than said second width dimension and said second width dimension being greater than said first width dimension.

12. The laterally diffused field effect transistor of claim 11, further comprising a gate electrode structure positioned above portions of said first and second well regions and above at least a portion of said trench isolation region.

13. The laterally diffused field effect transistor of claim 12, wherein said trench isolation region comprises an insulating layer and a conductive fill material that is electrically connected to an electrode material of said gate electrode structure.

14. The laterally diffused field effect transistor of claim 11, wherein said trench isolation region is segmented into a plurality of laterally separated isolation portions separated by respective space regions.

15. The laterally diffused field effect transistor of claim 14, wherein said drain region is segmented into a plurality of laterally separated drain portions.

16. The laterally diffused field effect transistor of claim 11, wherein a length of a channel region formed in said second well region is approximately 250 nm or less.

17. The laterally diffused field effect transistor of claim 11, wherein said trench isolation region is positioned laterally between said source region and said drain region.

18. A laterally diffused field effect transistor having a gate length direction and a gate width direction, the laterally diffused field effect transistor comprising:
a first well region formed above a substrate, said first well region and said substrate having a first conductivity type;
a plurality of spaced-apart drain regions having said first conductivity type, each of said plurality of spaced-apart drain regions being formed within said first well region and having a first width dimension in said gate width direction;
a second well region having a second conductivity type that is opposite of said first conductivity type, said first well region being formed within said second well region;
a source region having said first conductivity type, said source region being formed within said second well region and having a second width dimension in said gate width direction that is greater than said first width dimension;
a plurality of spaced-apart trench isolation regions positioned in said first well region, each of said plurality of spaced-apart trench isolation regions having a third width dimension in said gate width direction that is less than said second width dimension and greater than said first width dimension, wherein each respective one of said plurality of spaced-apart trench isolation regions is positioned laterally between said source region and a corresponding one of said plurality of spaced-apart drain regions; and
a gate electrode structure positioned above a portion of said first well region, above a portion of said second well region, and above at least a portion of each of said plurality of spaced-apart trench isolation regions.

19. The laterally diffused field effect transistor of claim 18, wherein a first combined width dimension of said plurality of spaced-apart drain regions having said first width dimension in said gate width direction is less than said second width dimension of said source region, and wherein a second combined width dimension of said plurality of spaced-apart trench isolation regions having said third width dimension in said gate width direction is less than said second width dimension of said source region and greater than said first combined width dimension, said first combined width dimension comprising a sum of said first width dimensions of each of said plurality of spaced-apart drain regions, and said second combined width dimension comprising a sum of said third width dimensions of each of said plurality of spaced-apart trench isolation regions.

20. The laterally diffused field effect transistor of claim 18, wherein said first well region has a lower concentration of dopant species with said first conductivity type than each of said plurality of spaced-apart drain regions.

* * * * *